US008825413B2

(12) United States Patent
Misharin et al.

(10) Patent No.: US 8,825,413 B2
(45) Date of Patent: Sep. 2, 2014

(54) SPECTRAL DECONVOLUTION IN ION CYCLOTRON RESONANCE MASS SPECTROMETRY

(75) Inventors: Alexander Misharin, Columbia, MD (US); Konstantin Novoselov, Columbia, MD (US); Vladimir M. Doroshenko, Sykesville, MD (US)

(73) Assignee: Science & Engineering Services, Inc., Columbia, MD (US)

( * ) Notice: Subject to any disclaimer, the term of this patent is extended or adjusted under 35 U.S.C. 154(b) by 1182 days.

(21) Appl. No.: 12/755,977

(22) Filed: Apr. 7, 2010

(65) Prior Publication Data

US 2011/0251801 A1 Oct. 13, 2011

(51) Int. Cl.

*G01N 31/00* (2006.01)
*H01J 49/38* (2006.01)
*H01J 49/00* (2006.01)
*H03F 1/26* (2006.01)

(52) U.S. Cl.

CPC ............ *H01J 49/0036* (2013.01); *H01J 49/38* (2013.01)
USPC ............................................ 702/32; 702/189

(58) Field of Classification Search

CPC ...... H01J 49/0036; H01J 49/38; H01J 49/443
See application file for complete search history.

(56) References Cited

U.S. PATENT DOCUMENTS 4,990,775 A 2/1991 Rockwood et al.

FOREIGN PATENT DOCUMENTS

SU 1307492 A1 4/1987
SU 1684831 A1 10/1991

OTHER PUBLICATIONS

E.N. Nikolaev, M.V. Gorshkov, "Dynamics of Ion Motion in an Elongated Cylindrical Cell of an ICR Spectrometer and the Shape of the Signal Registered" International Journal of Mass Spectrometry and Ion Processes, 64 (1985), pp. 115-125.
E.N. Nikolaev, V.S. Rakov, J.H. Futrell, "Analysis of harmonics for an elongated FTMS cell with multiple electrode detection" International Journal of Mass Spectrometry and Ion Processes, 157/158, (1996), pp. 215-232.
Y. Pan, D.P. Ridge and A. Rockwood, "Harmonic Signal Enhancement in Ion Cyclotron Resonance Mass Spectrometry Using Multiple Electrode Detection" International Journal of Mass Spectrometry and Ion Processes, 84 (1988), pp. 293-304.
A. Marshall, C. Hendrickson, G. Jackson, "Fourier Transform Ion Cyclotron Resonance Mass Spectrometry: A Primer" Mass Spectrometry Reviews, (1998), pp. 1-35.
W. Shockley, "Currents to Conductors Induced by a Moving Point Charge" Journal of Applied Physics, vol. 9, Oct. 1938, pp. 635-636.
A. Misharin, R. Zubarev, V. Doroshenko, "A 5-T desk-top FR-ICR MS instrument with O-trap cell: R=105 (m/z 400) in 0.2 s" 57$^{th}$ ASMS Conference, May 31-Jun. 4, 2009, 1 page.
A. Misharin, R. Zubarev, "Coaxial multi-electrode FTICR cell for high-sensitivity detection at multiple frequency: main design and modeling results", American Society for Mass Spectrometry, conference-poster presentation (2006), 1 page.
A. Misharin, R. Zubarev, "Coaxial multi-electrode cell ('O-trap') for high-sensitivity detection at a multiple frequency in Fourier transform ion cyclotron resonance mass spectrometry: main design and modeling results" Rapid Communications in Mass Spectrometry, (2006), pp. 3223-3228.
P. Sagulenko, D. Tolmachev, A. Vilkov, V. Doroshenko, M. Gorshkov, "Performance enhancement for a hybrid 1 T permanent magnet ESI-FTICR mass spectrometer using multiple frequency detection" American Society for Mass Spectrometry, conference-poster presentation (2008) 1 page.
M. Gorshkov, L. Tolic, J. Bruce, G. Anderson, R. Smith, "A Dual-Trap Design and Its Applications in Electrospray Ionization FTICR Mass Spectrometry", Analytical Chemistry, vol. 69, No. 7. Apr. 1, 1997, pp. 1307-1314.
S. Smith, "Fourier Transform Properties", The Scientist and Engineer's Guide to Digital Signal Processing, First & Second Editions (1997, 1999), pp. 185-208.

*Primary Examiner* — Eric S Dejong
(74) *Attorney, Agent, or Firm* — Oblon, Spivak, McClelland, Maier & Neustadt, L.L.P.

(57) ABSTRACT

A method and system for deconvolution of a frequency spectrum obtained in an ICR mass spectrometer based on a detection of ion oscillation overtones of the M-th order (where the integer M>1). A plurality of frequency peaks is collected within the frequency spectrum corresponding respectively to oscillations of different groups of ions, and associates at least one of the frequency peaks having a frequency f and a measured amplitude A with a particular group of the ions. The method and system identify whether the frequency peak is related to one of an overtone frequency, a subharmonic frequency, a higher harmonic frequency, or a side-shifted frequency of the oscillations of the different group of ions. The method and system derive calculated amplitudes of the overtone frequency peaks associated with the groups of ions by incorporating measured amplitudes of the frequency peaks related to the subharmonic frequency, the higher harmonic frequency, or the side-shifted frequency associated with the groups of ions into the calculated amplitudes of the overtone frequency peaks. The method and system generate a deconvoluted frequency spectrum including the overtone frequency peaks associated with the different groups of ions.

19 Claims, 13 Drawing Sheets

SPECTRAL DECONVOLUTION IN ION CYCLOTRON RESONANCE MASS SPECTROMETRY

CROSS REFERENCE TO RELATED APPLICATIONS

This application is related to, entitled "AN ION CYCLOTRON RESONANCE MASS SPECTROMETER SYSTEM AND A METHOD OF OPERATING THE SAME" filed Apr. 7, 2010, U.S. Ser. No. 12/756,015, the entire contents of which are incorporated herein by reference.

BACKGROUND OF THE INVENTION

1. Field of Invention

This invention relates to ion cyclotron resonance (ICR) mass spectrometers (MS), preferably to Fourier transform ICR (FTICR) MS, in which the detection of repetitive oscillations of clouds of ions is performed at fundamental or overtone frequencies and the analysis of those frequencies allows a mass spectrum to be determined.

2. Discussion of the Background

In a cyclotron resonance (ICR) mass spectrometer (MS) the mass-specific cyclotron motions of the ions in a magnetic field are detected as image currents induced by the ions in detection electrodes.

A discrete Fourier transformation (DFT), a form of Fourier transformation (FT) used for discrete signals, is usually used to convert the detected currents into a spectrum of the ion oscillation frequencies which is then converted into a mass spectrum using a mathematical calibration procedure that typically accounts for numerous distortions to the frequency spectra caused, for example, by superimposed magnetron motion or ion space charge. In addition to DFT, and particularly fast Fourier transformation (FFT), other types of mathematical transformations (for example, wavelet and chirplet transforms, shifted-basis techniques, or filter-diagonalization method) can be used to convert the time domain of the detected image currents into the frequency spectrum.

Typically, in ICR mass spectrometers the detection of fundamental frequencies of ion oscillations is performed. The problems associated with the detection of the fundamental frequencies are widely known and typically include space charge effects, non-ideality of the magnetic and electric fields used, and distortions in the detection system. The latter usually results in observation of harmonic frequencies (multiples of the fundamental one) in the frequency spectra that can result in observation of "ghost" peaks in the mass spectrum. The problem of the "ghost" peaks in ICR-MS based on the detection of the ion fundamental frequencies is usually solved by designing a detection system as close to an ideal one (i.e., one having ideal sine waveform response on the system's fundamental oscillation) as possible. In another method, software processing is used to remove the harmonics from the frequency spectrum in a regular FTICR-MS. See Franzen and Michelmann, US Pat. Appl. 2009/0084949, the entire contents of which are incorporated herein by reference.

In addition to ICR mass spectrometers based on the detection of the ion fundamental frequencies, there is another type of mass detection based on the detection of the ion oscillation overtone frequencies. Overtone frequencies are typically a multiple of the fundamental frequency. There is a difference between oscillation harmonics and oscillation overtones. Harmonics are usually observed due to system non-ideality (for example, due to deviation of system potential energy from harmonic one) or distortions in signal processing (like clipping sine waveforms). In contrast, overtones can be observed even in the absence of non-ideal factors and signal distortions. Both overtones and harmonics relate to a system fundamental oscillation (which can be thought of as system small oscillation at the lowest characteristic frequency). Since both fundamental and overtone oscillations can be observed at ideal conditions (i.e., at ideal harmonic potential and without signal distortions), the overtone observation is determined by factors other than system non-idealities, particularly by methods of oscillation generation or detection. For example, in a guitar, overtones can be generated by a special plucking of a guitar string. In quantum mechanics, an overtone excitation of a harmonic oscillator corresponds to its excitation to the energy level corresponding to more than one quantum.

"Synchronized" magnetron motion (described below) is responsible for the appearance of the side-shifted peaks, and this type of ion motion is very difficult to avoid in a typical ICR experiment. The relative intensity of subharmonics, harmonics, and side-shifted peaks in ICR-MS spectra increases significantly with the increase of the overtone order on which detection is performed. Therefore, the same magnitude of the "synchronized" ion magnetron motion and degree of imperfections in the detection system in a conventional detection scheme and the one with overtone detection will result in significantly higher level of the subharmonics and side-shifted peaks in the latter one compared to the level of harmonics in the former, conventional detection system. The problem of the "ghost" peaks (i.e., subharmonics and side-shifted peaks) is significantly exacerbated in the overtone detection schemes compared to the problem of harmonics in conventional detection of the ion fundamental oscillations.

As mentioned above, there are two primary conventional ways to fight the "ghost" peaks in a regular ICR-MS with the detection of the fundamental oscillations. The preferred one is based on optimizing ICR-MS hardware by designing an "ideal" detection system that does not generate harmonic frequencies in the detected signal. The other one is based on software processing to remove the harmonics in the detected frequency spectrum.

The following references are incorporated by reference herein in their entirety and describe background technology:

1) Nikolaev E. N., et al. USSR Inventor's Certificate SU1307492, 1985.

2) Nikolaev E. N., et al. USSR Inventor's Certificate SU1683841, 1989.

3) Rockwood A., et al. U.S. Pat. No. 4,990,775, 1991.

4) Pan Y., Ridge D. P., Rockwood A. L., Int. J. Mass Spectrom. Ion Processes 1988; 84: 293.

5) Nikolaev E. N., Gorshkov M. V., Int. J. Mass Spectrom. Ion Processes, 64 (1985) 115-125.

6) Nikolaev E. N., Rakov V. S., Futrell J. H., Int. J. Mass Spectrom. Ion Processes, 157/158 (1996) 215-232.

7) Marshall A. G., Hendrickson C. L., Jackson G. S., Mass Spectrom. Rev. 1998; 17: 1.

8) Misharin A. S., Zubarev R. A., In: Proc. 54$^{th}$ ASMS Conference, Seattle, Wash., 2006, Session: Instrumentation—FTMS-210.

9) Shockley W., Journal of Applied Physics, Vol. 9, 1938, 635.

10) Smith S. W., "The Scientist & Engineer's Guide to Digital Signal Processing," California Technical Pub.; 1st edition (1997).

11) Misharin A. S., Zubarev R. A., Rapid Commun. Mass Spectrom. 2006; 20: 3223-3228.

12) Misharin A. S., Zubarev R. A., Doroshenko V. M., In: Proc. 57th ASMS Conference, Philadelphia, Pa., 2009, Session: Instrumentation—FTMS-285.

13) Gorshkov M. V., Paša-TolićL., Bruce J. E., Anderson G. A., Smith R. D. Anal. Chem. 1997, 69, 1307-1314.

SUMMARY OF THE INVENTION

In one embodiment of the invention, there is provided a method for deconvolution of a frequency spectrum obtained in an ICR mass spectrometer based on a detection of ion oscillation overtones of the M-th order (where the integer M>1). The method collects a plurality of frequency peaks within the frequency spectrum corresponding respectively to oscillations of different groups of ions, and associates at least one of the frequency peaks having a frequency f and a measured amplitude A with a particular group of the ions. The method identifies whether the frequency peak is related to one of an overtone frequency, a subharmonic frequency, a higher harmonic frequency, or a side-shifted frequency of the oscillations of the different group of ions. The method derives calculated amplitudes of the overtone frequency peaks associated with the groups of ions by incorporating measured amplitudes of the frequency peaks related to the subharmonic frequency, the higher harmonic frequency, or the side-shifted frequency associated with the groups of ions into the calculated amplitudes of the overtone frequency peaks. The method generates a deconvoluted frequency spectrum including the overtone frequency peaks associated with the different groups of ions.

In one embodiment of the invention, there is provided a system for a system for deconvoluting a frequency spectrum obtained in an ICR mass spectrometer based on detection of ion oscillation overtones of the M-th order (where the integer M>1) The system includes a data collection unit configured to collect a plurality of frequency peaks within the frequency spectrum corresponding to oscillations of different groups of ions, to associate at least one the frequency peaks having a frequency f and an amplitude A with a particular group of the ions, and to identify whether the frequency peak is related to the overtone frequency of oscillations of the group of ions, a subharmonic frequency, a higher harmonic frequency, or a side-shifted frequency thereof. The system includes a data processing unit configured to generate calculated amplitudes of the overtone frequency peaks associated with the groups of ions by incorporating the amplitudes of the frequency peaks related to subharmonic, higher harmonic, or side-shifted frequencies associated with the groups of ions into the calculated amplitudes of said overtone frequency peaks. The data processing unit is configured to generate a deconvoluted frequency spectrum composed of the overtone frequency peaks associated with the different groups of ions.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAIL DESCRIPTION OF THE INVENTION

A frequency spectrum in the invention is a result of detection of ion oscillation motions and includes different frequency components. A frequency spectrum as detailed below refers to a plot or a list or a table of frequency components or peaks. This plot or list or table can appear in software as well as in hardware. A frequency spectrum can also include a mass spectrum as these spectra are related by a simple calibration transformation (as discussed below).

Typically, several frequency components constitute a frequency peak which can be associated with oscillations of particular ions. A fundamental frequency $F_0$ of a periodic signal is the inverse of the period length. A harmonic is a component frequency of the signal that is an integer multiple of the fundamental frequency: $f_k=kF_0$ where k is the harmonic order. Harmonics are present in the detected signal due to system non-ideality or distortions in the signal detection or processing. An overtone is a natural resonance of a system. In simple cases, the frequencies of the overtones are the same as (or close to) the harmonics: $F_M=MF_0$ for the overtone oscillation of the M-th order (M>1). The subharmonic and higher harmonic frequencies $f_{m/M}$ are present in the detected signal corresponding to the overtone oscillations due to system non-ideality or distortions in the overtone signal detection or processing. Their frequencies are equal to an integer fraction of the overtone frequency: $f_{m/M}=(m/M)F_M$ where m≥1 and the cases of m<M and m>M correspond to the subharmonic and higher harmonic frequencies, respectively.

Although subharmonics, side-shifted peaks, and harmonics related to the overtone frequency Mfoccur at different positions in the frequency spectra, these peaks all have one property in common: these peaks all are generated due to motion of ions with one and the same mass-to-charge ratio m/z. Signal generated in the detection system (called time domain) by that ion motion has certain energy. Generally, Fourier transformation of the signal results in a frequency spectrum with multiple peaks in it (fundamental or overtone frequency, its harmonics, subharmonics, and side-shifted peaks). Since the time and frequency domains are equivalent representations of the same signal, these signals must represent the same energy. However, in the frequency domain the spectral power is distributed among many components corresponding to the same signal in the time domain.

A rotating oscillator in general is an example where both fundamental and overtone oscillations can be observed. In this oscillator, fundamental oscillations are detected by merely projecting the orbital motion to a linear axis. Overtones are usually observed by using special detection schemes.

Figure 1:
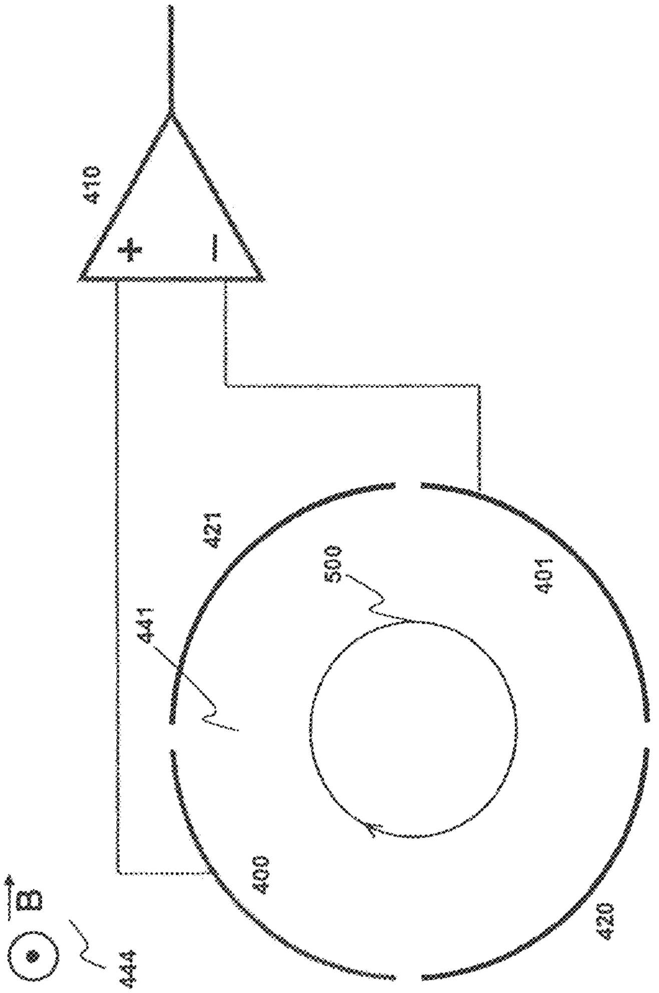
FIG. 1 is a schematic representation of a detection electrode arrangement according to one embodiment of the invention.
Figure 2:
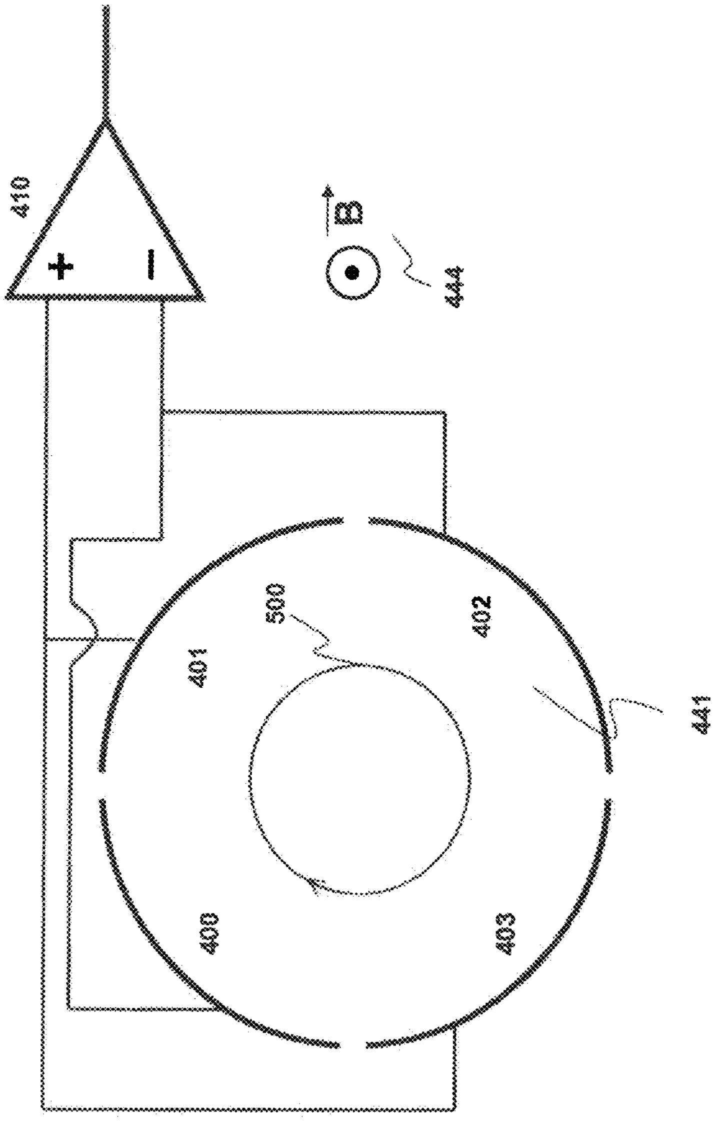
FIG. 2 is a schematic representation of another detection electrode arrangement and process according to one embodiment of the invention.
Figure 3:
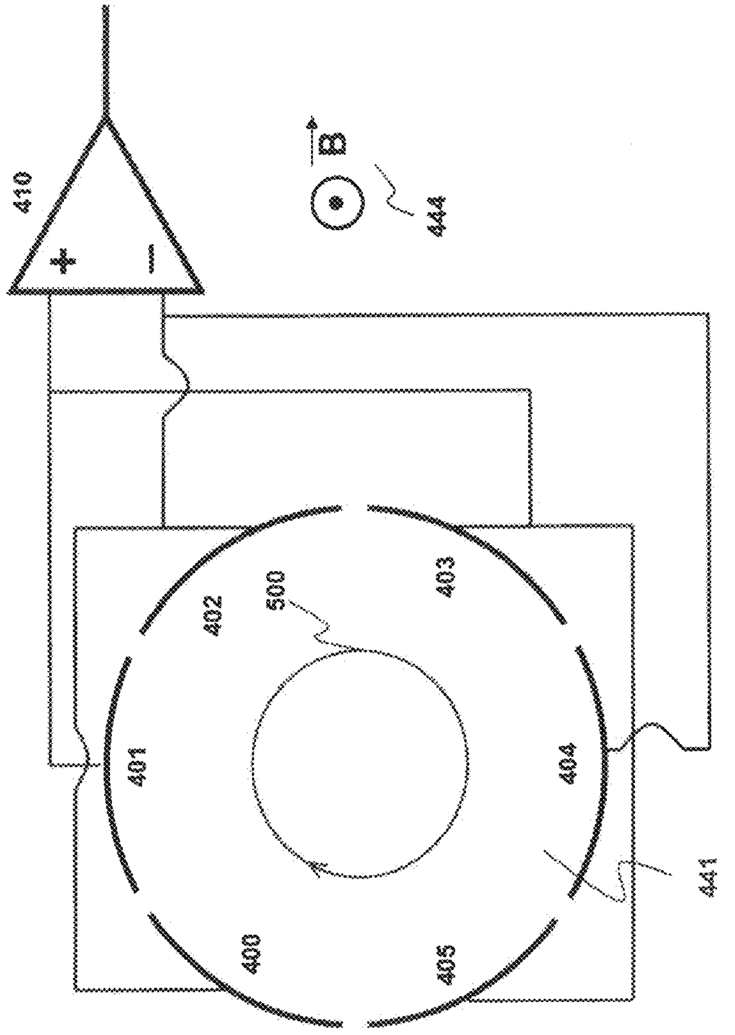
FIG. 3 is a schematic representation of another detection electrode arrangement and process according to one embodiment of the invention.
Figure 4:
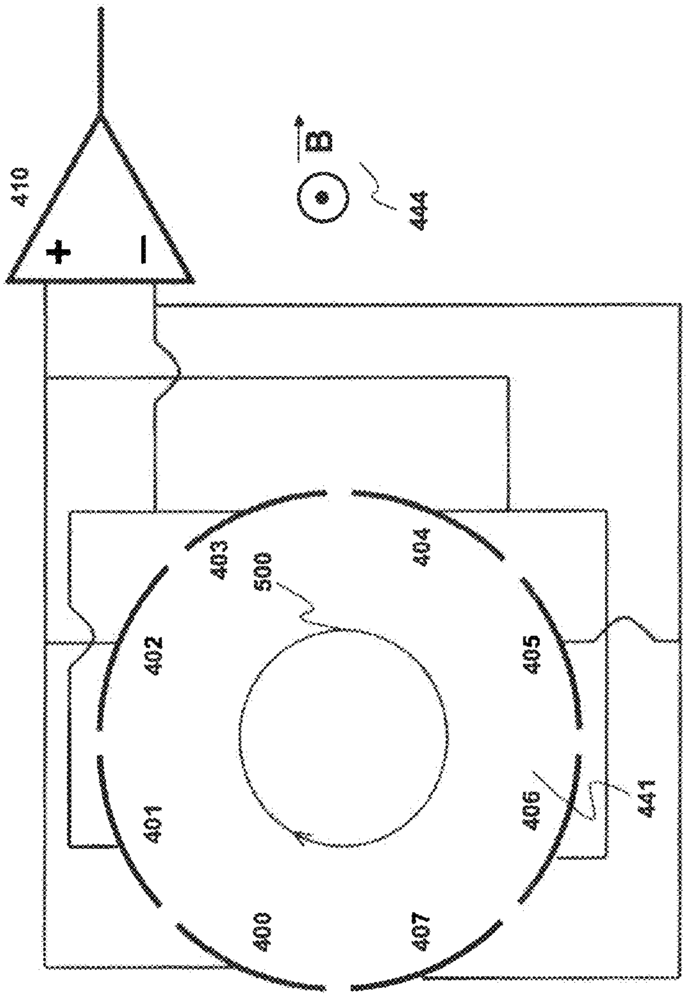
FIG. 4 is a schematic representation of a conventional detection scheme.

Referring now to the drawings, wherein like reference numerals designate identical, or corresponding parts throughout the several views, and more particularly to FIG. 1, an example of such detection scheme in the case of a rotating ion in FTICR-MS is shown in FIG. 1 where a double overtone of the ion oscillation is detected. FIGS. 2 and 3 are schematics of systems for detection of triple and quadruple overtones, respectively. This method can be extended to the detection of the overtones of any order. It may also be used in comparison to a detection scheme of the ion oscillation fundamental frequency as shown in FIG. 4.

There are various benefits to the detection of the overtone frequencies in FTICR-MS as compared to the detection of the fundamental frequencies that account for the use of the overtone detection schemes. Among the benefits is a higher mass resolving power achieved over a certain time period observed at typical FTICR-MS conditions. Those conditions include the case of homogeneous broadening of ion peaks in mass spectra (typical for collision-induced broadening).

For example, in the case of the detection of the triple overtones, the detected frequency is increased by three times compared to the fundamental one while the peak width remains the same (typically, the peak width is controlled by duration of the signal acquisition). This results in tripling the mass resolving power for a given signal duration in the case of detection of the triple overtones. The increase in the mass resolving power achieved over a certain time period is valuable by itself, but it can also be transformed into sample analysis throughput. Because the resolving power in FTICR-MS is normally proportional to the detection period duration, in the case of the detection of the triple overtones, one can get the same resolving power as in the case of the detection of the fundamental frequencies but with three times shorter detection period resulting in higher throughput (up to three times more spectra acquired per second). Another benefit of using shorter detection period is a reduced requirement for the vacuum in an ICR measuring cell. All these factors account for interest in detection schemes based on measuring the overtone frequencies.

The interpretation of the frequency spectra obtained by using overtone detection schemes can be complicated by the presence of the "ghost" frequency peaks. However, in the overtone detection case, the ghost peak problem is more severe. Specifically, overtone detection schemes bring additional complications into the frequency spectra, namely, subharmonics and side-shifted peaks.

Side-shifted peaks in an ICR-MS frequency spectrum are considered a result of splitting main spectral frequency components due to ion magnetron or axial motion in an ICR-MS. A spectral deconvolution in an ICR-MS frequency spectrum is a procedure of a recovery of amplitudes of the main frequency components (which correspond to ion fundamental or overtone frequencies depending on the detection scheme used) after splitting them into different harmonic, subharmonic, and side-shifted peaks due to ion magnetron and axial motions and distortions in the signal detection system. Because a mass spectrum in an ICR-MS is related to the frequency spectrum by a simple calibration transformation, the spectral deconvolution in the ICR-MS mass spectrum and the spectral deconvolution in the ICR-MS frequency spectrum contain substantially the same kind of information.

In an ICR-MS based on the detection of overtone oscillations, the hardware approach to eliminate ghosts is virtually impossible. Common software processing where the "ghost" peaks are removed from the spectra is also not a solution, because in the case of the detection of the overtone frequencies, these "ghost" peaks may contain most of the signal power associated with particular ions. In the overtone frequency spectra, the "ghost" peaks can be several times more intense than the main overtone peak.

This invention describes methods and systems to account those "ghost" peaks in the final computed mass spectrum. One embodiment of the invention is based on collection (i.e., recovery) of all power of image currents associated with oscillating particular ions and adding the recovered power to the main frequency peak (which corresponds to ion fundamental or overtone peak depending on the detection scheme used). This deconvolution procedure eliminates ghost peaks in the frequency spectrum and restores the power of the main peaks to the level corresponding to the number of ions in an ICR cell that in principle can make quantitative analysis in ICR-MS possible.

By using the deconvolution procedure of the invention, one can recover amplitudes of the main frequency components after splitting the induced ion signal into different harmonic, subharmonic, and side-shifted peaks. This deconvolution procedure is especially important in the case of the detection of ion overtone oscillations where subharmonic and harmonic components are substantial and cannot be neglected.

While throughout this description a Fourier transform is discussed as a common and typical method of transformation of the measured image current signal into the frequency domain spectrum, other transformation methods (such as for example wavelet and chirplet transforms, shifted-basis techniques, or filter-diagonalization methods) can also be applied for this transformation. While ICR-MS instruments are described to discuss the system and methods of the invention, the described transformation methods also apply to FTICR-MS and other MS systems such as radiofrequency ion traps, and electrostatic ion traps where frequency of ion oscillations is measured to obtain mass spectra.

Theoretical considerations of the appearance of harmonics, subharmonics and magnetron motion-induced side-shifted peaks in ICR spectra have been discussed in works of Nikolaev et al. such as Nikolaev E. N., Gorshkov M. V., Int. J. Mass Spectrom. Ion Processes, 64 (1985) 115-125 and Nikolaev E. N., Rakov V. S., Futrell J. H., Int. J. Mass Spectrom. Ion Processes, 157/158(1996) 215-232, the contents of both of these references are incorporated herein in their entirety by reference. These works considered an infinite cylindrical cell with two (2) and general case of 2M ($M \geq 1$) detecting electrodes.

Ions in the cell were considered as an infinite thread of charges performing a combination of the cyclotron and magnetron motions. The current resulting from redistribution of charges on the detecting plates caused by ion motion in the cell was considered to be the signal picked up from the detecting electrodes.

One type of ion motion is a "central motion" when ions perform cyclotron motion around the center of the cell and radius of the magnetron motion is zero. In this case, the signal detected includes only the odd harmonics Mf, 3Mf, 5Mf, . . .

and no splitting or shifting of harmonics takes place. Here, f is the (reduced) frequency of the ion cyclotron motion and detection is performed on the frequency Mf (fundamental or overtone; case M=1 corresponds to the detection on the fundamental frequency, f).

When ions have non-zero radii of the magnetron motion, two cases were considered. In the first one, guiding centers of the ion cyclotron motion are uniformly distributed along the magnetron orbit. This was the "non-synchronized magnetron motion" case. In the second case, cyclotron rotation centers for all ions are located at the same point; the ion magnetron motion is "synchronized." The simplest case of the "synchronized magnetron motion" is the motion of a single ion with non-zero magnetron and cyclotron radii.

Analysis by others for the case of the "synchronized magnetron motion" reveals that detected signal in this case contains odd harmonics of the frequency (Mf, fundamental or overtone) on which detection is performed: Mf, 3Mf, 5Mf, etc. along with the side-shifted signals for integer multiples of the fundamental frequency f.

The distances from the side-shifted signals to the integer multiples of the fundamental frequency f are usually equal to the integer multiples $kf_{mag}$ of the magnetron frequency $f_{mag}$. Further, the values of the k coefficient were preferentially positive (k>0, integer). For example, in the case of conventional detection scheme (two detecting electrodes, M=1), the dominant signal components will be those at the fundamental frequency f, its odd harmonics (3f, 5f, 7f, etc.), and the side-shifted signals at the frequencies $Af+Bf_{mag}$ where A, B are integers, A≥0, B≥0, B takes even values for odd values of A, and odd values when A is even or zero; this rule indicates the presence of series of the side-shifted signal components: $f+2f_{mag}$, $f+4f_{mag}$, . . . ; $2f+f_{mag}$, $2f+3f_{mag}$, . . . ; $3f+2f_{mag}$, etc. The same conclusions about the signal components for the case of the "synchronized magnetron motion" have been found by others using an approach based on computer simulations and utilization of the "reciprocity" theorem.

Analysis of the "non-synchronized magnetron motion" case shows that the signals detected in this case utilize only odd harmonics of the frequency (Mf, fundamental or overtone) on which detection is performed: Mf, 3Mf, 5Mf, etc. This result shows that the case of the "non-synchronized magnetron motion" is equivalent to the case of the "central motion" in terms of the components present in the signal. Simulations performed by the present inventors using analytical expression for the induced-charge density used in the works of Nikolaev et al. (described above) confirm the presence of only the odd harmonics of the frequency Mf in the signal in the case of the "non-synchronized magnetron motion."

The abovementioned equivalence can be understood if one notes that, in both of these cases ("central ion motion" and "non-synchronized magnetron motion"), magnetron motion does not cause any additional asymmetries in the signal detected because either its radius is zero ("central ion motion") or because it does not change the distribution of the charge density in the cell which changes only due to the ion cyclotron motion ("non-synchronized magnetron motion" case).

The ideal case of the "non-synchronized magnetron motion" generally requires infinite number of ions with guiding centers of their cyclotron motion uniformly distributed along the magnetron orbit. This corresponds to averaging (related to integration over [0; 2π] interval) over the angular coordinate of the magnetron rotation center.

The present inventors have discovered that the conclusion of Nikolaev et al. about the presence of signal components on integer multiples of the fundamental frequency other then odd harmonics (Mf, 3Mf, 5Mf, etc.) of the frequency (Mf, fundamental or overtone) on which detection is performed in the case of the "non-synchronized magnetron motion" is not correct. These signal components can appear in the spectra due to signal distortions other than that caused by the ion magnetron motion.

For example, when ions perform "central motion" around a center other than the center of the cell, spectra will contain signals on both even and odd integer multiples of the fundamental frequency. This example corresponds to the case when the center of the electric trapping potential in the cell does not coincide with its geometric center.

The present inventors moreover have discovered that the presence of harmonics, subharmonics and side-shifted peaks in the spectra is not necessarily a detrimental feature by itself because these signals in one embodiment of the invention can be used as a diagnostic tool which can reveal the presence of mechanical and/or electrical asymmetries in the cell as well as the extent of the "synchronized" magnetron motion" in the cell.

Analysis of the harmonics, subharmonics and side-shifted peaks permits one to distinguish the cause of appearance of the component signals in the spectra. For example, in the case of the two detecting electrodes, amplitudes of the signal components at the frequencies 2kf (k is integer) will be proportional to the degree of non-ideality of the mechanical assembly of the cell and/or asymmetry of the channels of the detection preamplifier. Further, magnitudes of the signal components at the above side-shifted frequencies $Af+Bf_{mag}$ will be proportional to the degree of the "synchronized ion magnetron motion."

In one embodiment of the invention, a general procedure for tuning and adjusting mechanical and electrical components of the cell as well as the process of its operation (ion injection, trapping, cooling, excitation, etc.) reduces the distorting factors in the cell by minimizing the level of the signal components corresponding to the mechanical and/or electrical non-idealities and those created by the "synchronized magnetron motion."

In one embodiment of the invention, the deconvolution procedure conserves the power/energy of the image currents associated with particular ions in the deconvoluted spectrum. This follows from the power conservation relation (i.e., Parseval's theorem) between the time domain signal and frequency domain in a Fourier transformation. This is important because the quantitative information on the ion population in an ICR cell is conserved in the deconvoluted spectrum.

Parseval's theorem establishes relation between the time domain and frequency domain representations of the detected signal.

For the case of discrete signal x[n] (common signal representation in information processing devices) the Parseval's relation takes the form:

$$\sum_{n=0}^{N-1} |x[n]|^2 - \frac{1}{N}\sum_{k=0}^{N-1} |X[k]|^2$$

where X[k]is the DFT of x[n], both of length N.

The interpretation of this form of the theorem is that the left side of this equation is the total energy contained in the time domain signal, found by summing the energies of the N individual samples. Likewise, the right side is the energy contained in the frequency domain, found by summing the energies of the frequency components.

Overtone detection schemes have been referred to as "multiple electrode" detection schemes. Conventional detection schemes (M=1) utilize 2M=2 detection electrodes while number of detection electrodes used in overtone detection schemes (M>1) is typically 2M≥4, M is an integer number. Both for the conventional and overtone detection schemes detection electrodes are arranged with 2M-fold symmetry about the axis of the coherent cyclotron motion of the observed ions. In one of the implementations of the overtone detection scheme, an even number of detection electrodes is utilized and the difference between the sum of the signals from every other electrode, and the sum of the signals from the remaining electrodes constitutes the detected signal. The signal includes components (overtone frequency, its harmonics and subharmonics, and side-shifted peaks) described above.

FIG. 1 is a schematic representation of a conventional detection scheme performing detection of the fundamental ion rotational oscillations 500 (M=1), it has one pair of detection electrodes. Detection electrodes 400 and 401 connected to different inputs of the image current preamplifier 410. FIG. 1 also shows electrodes 420 and 421 used for excitation of the ion circular oscillations 500.

General principles of operation of conventional FT-ICR cells are described in detail in the published literature [Marshall A G, Hendrickson C L, Jackson G S. *Mass Spectrom. Rev.* 1998, 17: 1; Guan S, Marshall A G *International Journal of Mass Spectrometry and Ion Processes* 1995, 146/147: 261-296, the entire contents of these references are incorporated herein by reference. Briefly, ions to be analyzed are introduced into the volume of the FT-ICR cell surrounded by its excitation and detection electrodes (volume 441 in FIGS. 1-4) along the direction of the magnetic field B (arrow 444 in FIGS. 1-4) and trapped in that volume. This constitutes the so-called "ion injection" time interval (or "ion injection" event or, simply, "ion injection"). Ion trapping along the direction of the magnetic field is typically done using DC potentials applied to the so-called "trapping" electrodes (not shown in the FIGS. 1-4) typically positioned perpendicular to the direction of the magnetic field and located at both ends of the excitation and detection electrodes. Ion injection is typically followed by an "ion cooling" time interval, followed by "ion excitation" and "ion detection" time intervals. "Ion cooling" time interval serves to reduce excessive translational energy of the trapped ion population. During "excitation" time interval radiofrequency waveforms are applied across the excitation electrodes of the FT-ICR cell to bring the ions into synchronous cyclotron motion (500, FIGS. 1-4). During the following "detection" interval that ion motion is detected using the detection electrodes 400 and 401 an image charge preamplifier (410, FIGS. 1-4). Finally, FFT (or other type of transformation such as wavelet, chirplet transforms, shifted-basis techniques, or filter-diagonalization method) of the preamplifiers' signal gives a frequency spectrum which is converted to a mass spectrum by application of a suitable calibration transformation.

FIG. 2 is a schematic representation of the detection electrode arrangement in a detection scheme of a conventional ICR cell performing detection of the double overtone of the ion rotational oscillations 500 (M=2). This detection scheme has two pairs of detection electrodes. Detection electrodes 400, 402 are commutated to one input of the image current preamplifier 410 while detection electrodes 401, 403 are commutated to another input of the preamplifier 410.

FIG. 3 is a schematic representation of the detection electrode arrangement in a detection scheme of a conventional ICR cell performing detection of the triple overtone of the ion rotational oscillations 500 (M=3). This detection scheme has three pairs of detection electrodes. Detection electrodes 400, 402, and 404 are commutated to one input of the image current preamplifier 410 while detection electrodes 401, 403, and 405 are commutated to another input of the preamplifier 410. The configuration in FIG. 3 differs from that of FIGS. 1 and 2 in that the configuration in FIG. 3 has different number of detection electrodes, performs detection of the triple overtone of the ion rotational oscillations 500 while the configurations in FIGS. 1 and 2 perform detection of fundamental frequencies and the double overtone, respectively.

FIG. 4 is a schematic representation of the detection electrode arrangement in a detection scheme of a conventional ICR cell performing detection of the quadruple overtone of the ion rotational oscillations 500 (M=4). This detection scheme has four pairs of detection electrodes. Detection electrodes 400, 402, 404, and 406 are commutated to one input of the image current preamplifier 410 while detection electrodes 401, 403, 405, and 407 are commutated to another input of the preamplifier 410.

The electrode arrangements in FIGS. 2-4 show detection electrodes only. Ion circular motion 500 can be excited by commutating some of these electrodes to the source of the excitation waveform (not shown) during an excitation event and then back to the preamplifier 410, as shown in these figures, during detection. Ways of doing this are described in the published literature (Sagulenko P N, Tolmachev D A, Vilkov A, Doroshenko V M, Gorshkov M V *ASMS* 2008, Session: Instrumentation: FTMS-006, the entire contents of these references are incorporated herein by reference.

One of the implementations of the overtone detection scheme was demonstrated using a "O-trap"-geometry FT-ICR cell which is used here as a convenient implementation of the overtone detection scheme. The following description does not limit the scope of the invention to a particular ion trap geometry but rather serves the purposes of illustration and explanation only.

In the O-trap FT-ICR cell configuration, according to one embodiment of the invention, the functions of ion excitation and detection are separated between two different FT-ICR cell compartments and at least one of the compartments where detection of the ion motion takes place (termed "detection compartments" or "detection cells") has preferentially the "O-trap" geometry (see below). An FT-ICR cell with the "O-trap" geometry ("O-trap"-geometry cell) has internal coaxial electrodes around which ions with excited cyclotron motion revolve. Typically, "O-trap"-geometry cells are used exclusively for detection of the ion cyclotron motion which was excited in another cell ("excitation cell" or "excitation compartment") which generally can be of a conventional or other-than-"O-trap" design. One feature which distinguishes the O-trap FT-ICR cell configuration from any other FT-ICR cell configuration such as the dual cell one is that ion transfer between the excitation and detection compartments is performed after excitation of the coherent ion cyclotron motion. The possibility to perform such ion transfer was not demonstrated until recently by the work described in reference 12 above: Misharin A. S., Zubarev R. A., Doroshenko V. M., In: Proc. $57^{th}$ ASMS Conference, Philadelphia, Pa., 2009, Session: Instrumentation—FTMS-285).

The O-trap FT-ICR cell configuration compartment where excitation of the ion motion takes place (excitation compartment) can also have its own auxiliary mechanisms for detection of the ion motion. For example, one of the detection schemes presented in the FIGS. 1-4 can be utilized for that purpose. Separation of the excitation and detection functions between different FT-ICR cell compartments facilitates implementation of versatile excitation and detection techniques unattainable in a single compartment of the conventional FT-ICR cell. The terms "O-trap", "O-trap FT-ICR cell", "O-trap ICR cell" or "O-trap cell," as used herein, refer to an ICR cell configuration in which functions of the ion excitation and detection are separated between different compartments and at least one of the compartments where detection of the ion motion takes place has preferentially (although not necessarily) the "O-trap" geometry. The main principles of the O-trap FT-ICR cell operation are described in the references 8, 11, and 12 from above (Misharin A. S., Zubarev R. A., In: Proc. $54^{th}$ ASMS Conference, Seattle, Wash., 2006, Session: Instrumentation—FTMS-210; Misharin A. S., Zubarev R. A., Rapid Commun. Mass Spectrom. 2006, 20: 3223-3228; and Misharin A. S., Zubarev R. A., Doroshenko V. M., In: Proc. $57^{th}$ ASMS Conference, Philadelphia, Pa., 2009, Session: Instrumentation—FTMS-285), whose contents are incorporated herein in their entirety.

Figure 5:
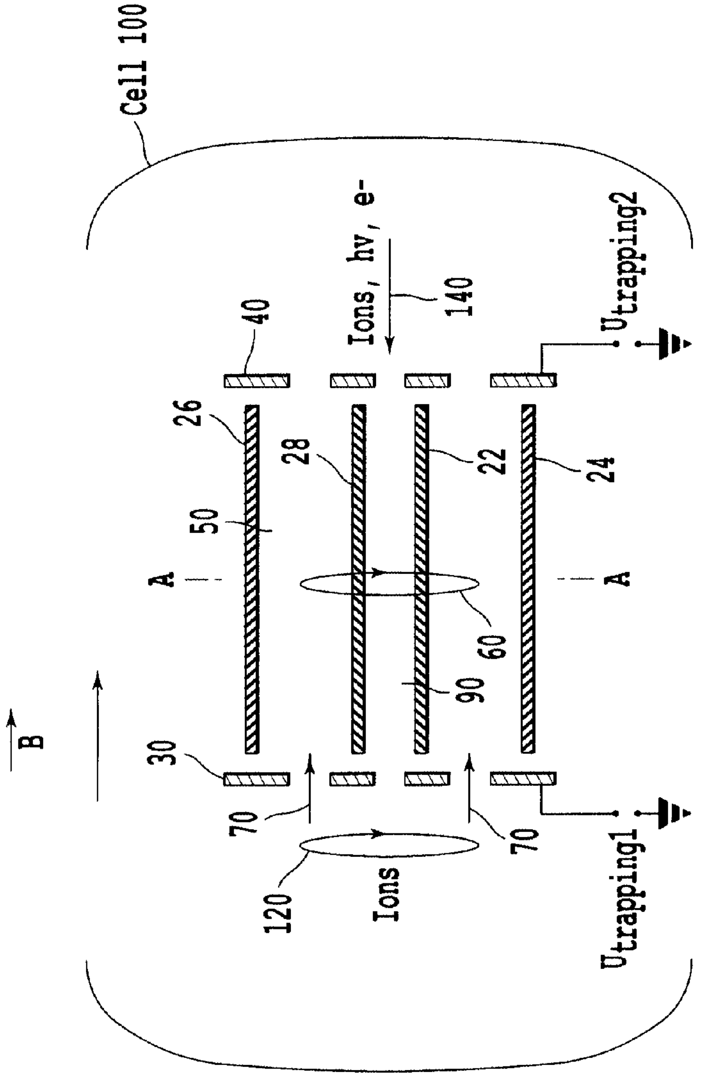
FIG. 5 is a schematic cross sectional view of an "O-trap"-geometry FT-ICR cell.

The "O-trap"-geometry cell can for example have the arrangement of electrodes as in FIG. 5. The "O-trap"-geometry cell 100, FIG. 5, is placed in a uniform magnetic field B and is enclosed within an evacuated chamber or envelope (not shown). The cell 100 is usually used solely for detection of the ion motion, and the ions entering the cell as indicated by the arrows 70 have cyclotron orbits 120 excited previously in another cell ("excitation" cell) that may be of a conventional type (not shown).

Figure 6:
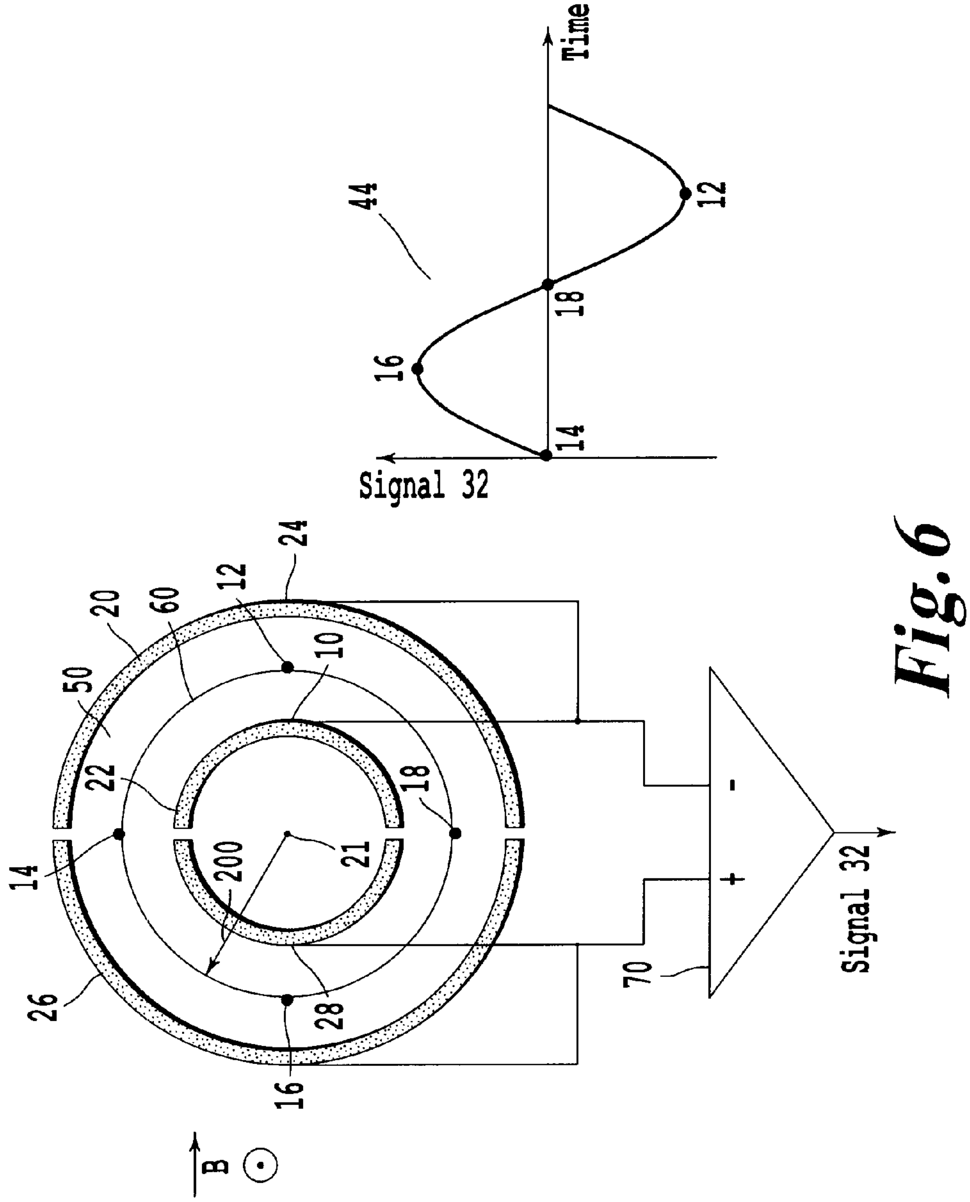
FIG. 6 is a schematic cross sectional view of the "O-trap"-geometry FT-ICR cell along the A-A plane shown in FIG. 5.

As FIG. 6 illustrates, the cell 100 includes differential detection scheme with positive detection electrodes 26 and 28 connected to the positive pole of the image signal amplifier 70, and negative detection electrodes 22 and 24 connected to the negative pole of the amplifier 70. The detection electrodes define two coaxial surfaces (cylinders in this particular case) 10 (inner) and 20 (outer) denoted by the dashed lines. Amplifier 70 produces the amplified signal 32.

The cell 100 also includes trapping plate electrodes 30 and 40 (FIG. 5). The volume confined between the surfaces 10 and 20 and the plates 30 and 40 is the inner trapping space 50. The ions are trapped inside the trapping volume 50 by a combination of the magnetic field B and trapping potentials $U_{trapping1}$ and $U_{trapping2}$ applied to the trapping electrodes 30 and 40, respectively. The center 21 of the cyclotron orbits 60 of ions moving in the volume 50 resides outside that volume and the radius 200 of the orbits 60 crosses the surfaces of the electrodes 22 and 28 (and, generally, the inner surface 10). One of the distinguishing features of the "O-trap"-geometry cell is, therefore, that the centers of the cyclotron orbits of the ions trapped in such cell lie outside the trapping volume of the cell and radii of the ion cyclotron motion cross the surface of one or more of the cell electrodes.

The space 90 indicated in the FIG. 5 and surrounded by the surface 10 (FIG. 6) can be utilized for the purposes of the particle (e.g., charged or neutral such as ions, electrons, photons, neutral atoms or molecules (possibly in excited and/or metastable states)) transport through it, as indicated by the arrow 140.

Electrodes of the "O-trap"-geometry cell can occupy surfaces other that the cylindrical ones (10 and 20, FIG. 6). An example of the "O-trap"-geometry cell in which electrodes are located on hyperbolic surfaces was given in the reference 8. Also, the number, shape and juxtaposition of the electrodes of the "O-trap"-geometry cell can be different from those shown in the figures accompanying the description of the invention.

The diagram 44 (FIG. 6) shows the evolution of the detected signal 32 in time. When the ions are in the position 14 or 18 of their orbit 60 (FIG. 6), their image signals on positive detection plates 26, 28 and negative detection plates 22, 24 are equal, and the amplified signal 32 is equal to zero. When the ions are in the positions 12 and 16, their image is preferentially detected by the negative (22, 24) and positive (26, 28) plates, respectively. Because of the cell geometry, at these positions the image charge induced on the opposite polarity plates is minimal, and most of the image charge is induced on the two detection plates of the same polarity, both of which are close to the ion trajectory 60. Thus, the amplitude of the image signal in cell 100 is larger than in the currently used cells of the same outer diameter.

Figure 7:
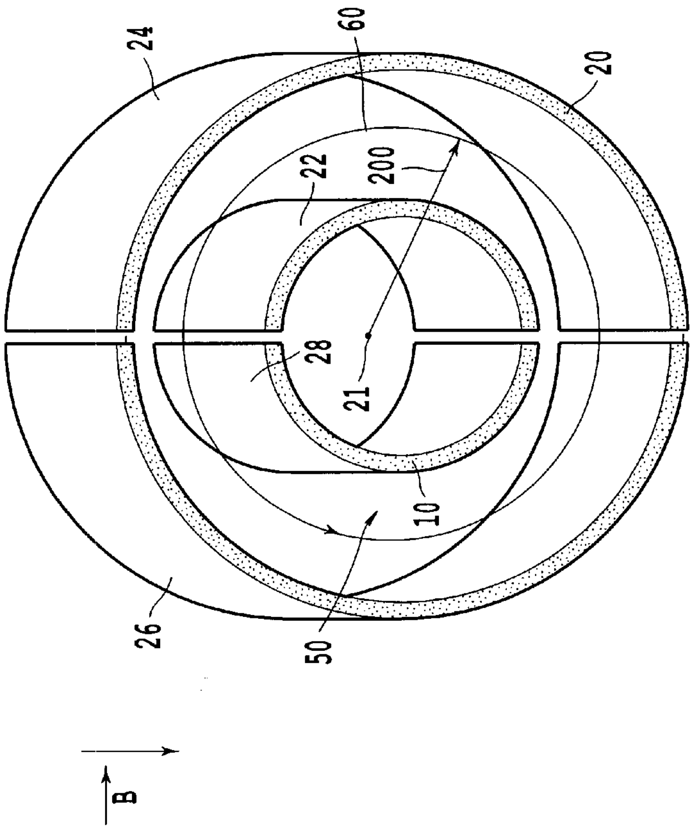
FIG. 7 is a three-dimensional view of the detection electrodes of the "O-trap"-geometry FT-ICR cell.

FIG. 7 shows a three-dimensional view of the detection electrodes of the cell 100 (FIGS. 5 and 6) with the ion cyclotron motion trajectory 60 between them.

The increase in the resolving power in the "O-trap"-geometry cell can be achieved by implementing an overtone detection scheme therein which, in turn, can be done by dividing each of the detecting electrodes 22, 24, 26, and 28 into two or more electrodes.

Figure 8:
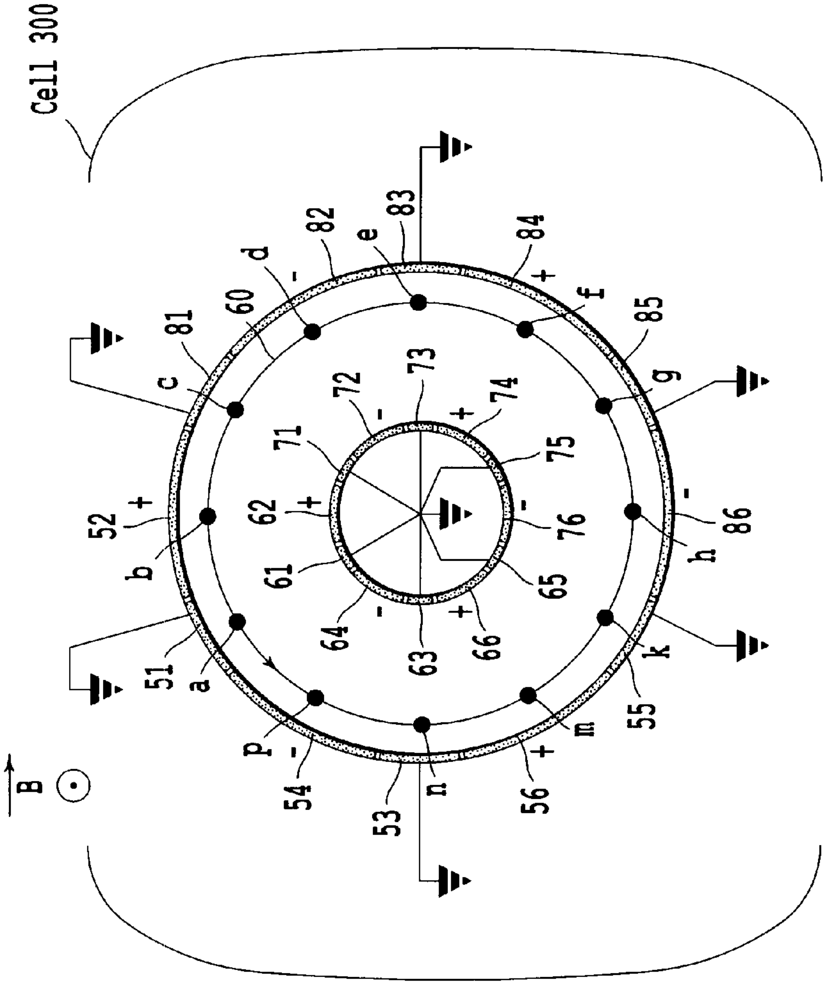
FIG. 8 is a cross sectional view of an "O-trap"-geometry FT-ICR cell performing detection of the triple overtone frequencies.

FIG. 8 presents cell 300 as one of the possible implementations of the detection scheme for triple overtone detection. In cell 300, the electrode 26 is split into three detecting electrodes 52, 54 and 56, separated by the grounded electrodes 51, 53 and 55. Similarly, the detecting electrode 28 is split into detecting electrodes 62, 64 and 66, separated by the grounded electrodes 61, 63 and 65, and the detecting electrode 22 is split into detecting electrodes 72, 74 and 76, separated by the grounded electrodes 71, 73 and 75, while the detecting electrode 24 is split into detecting electrodes 82, 84 and 86, separated by the grounded electrodes 81, 83 and 85. The detecting electrodes 52, 62, 56, 66, 74, and 84 are connected to the positive pole of the image signal amplifier 70, while the detecting electrodes 54, 64, 72, 82, 76, and 86 are connected to the negative pole.

Figure 9:
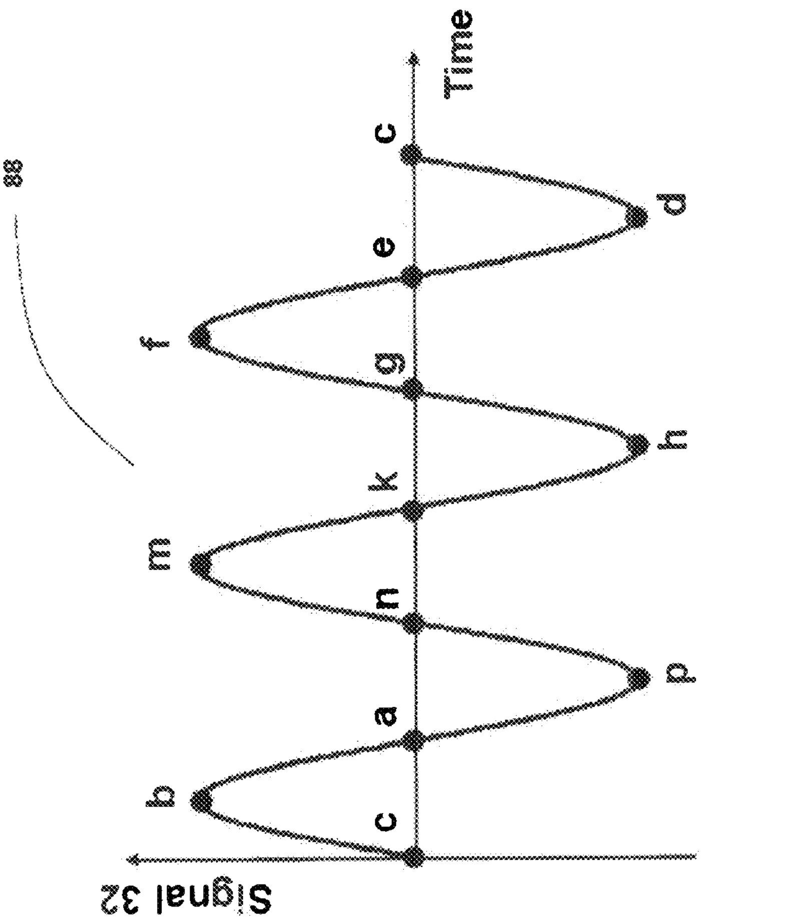
FIG. 9 is a schematic diagram showing time evolution of the signal detected in the "O-trap"-geometry FT-ICR cell performing detection of the triple overtone frequencies.

FIG. 9 shows the time diagram 88 which establishes a link between the position of the ion on the cyclotron orbit 60 and the polarity and the amplitude of the signal from the image signal amplifier 70. As evident from the time diagram 88, every revolution of the ion along the cyclotron orbit 60 produces three periods of the image signal. Thus the detected frequency is $3\cdot\omega_+$, where $\omega_+$ is the fundamental frequency of the ion cyclotron motion.

The grounded electrodes (e.g., elements 51, 53, 55, 61, 63, 65, 71, 73, 75, 81, 83, 85 in FIG. 8) can serve as a mean to reduce the amplitude of the harmonic, sub-harmonic and side-shifted signal components by making the image signal as close to the sinusoidal one as possible. In general, utilization of these grounded electrodes may not alleviate the problem of the undesirable (harmonics, sub-harmonics, side-shifted) signal components completely. Therefore, the teachings of the invention will remain valuable when one utilizes special mechanisms (such as grounded electrodes inserted between the detection electrodes of the cell) to reduce the level of the undesirable signal components.

In one embodiment of the invention, utilization of the overtone/multiple-electrode detection in an O-trap cell provides mass resolving power enhancement during detection times shorter than total duration of the transient signal. The increase in mass resolving power using 2M detection electrodes is equal to the order M of the frequency multiplication as has been demonstrated for the cases of M=2 and M=3.

Figure 10:
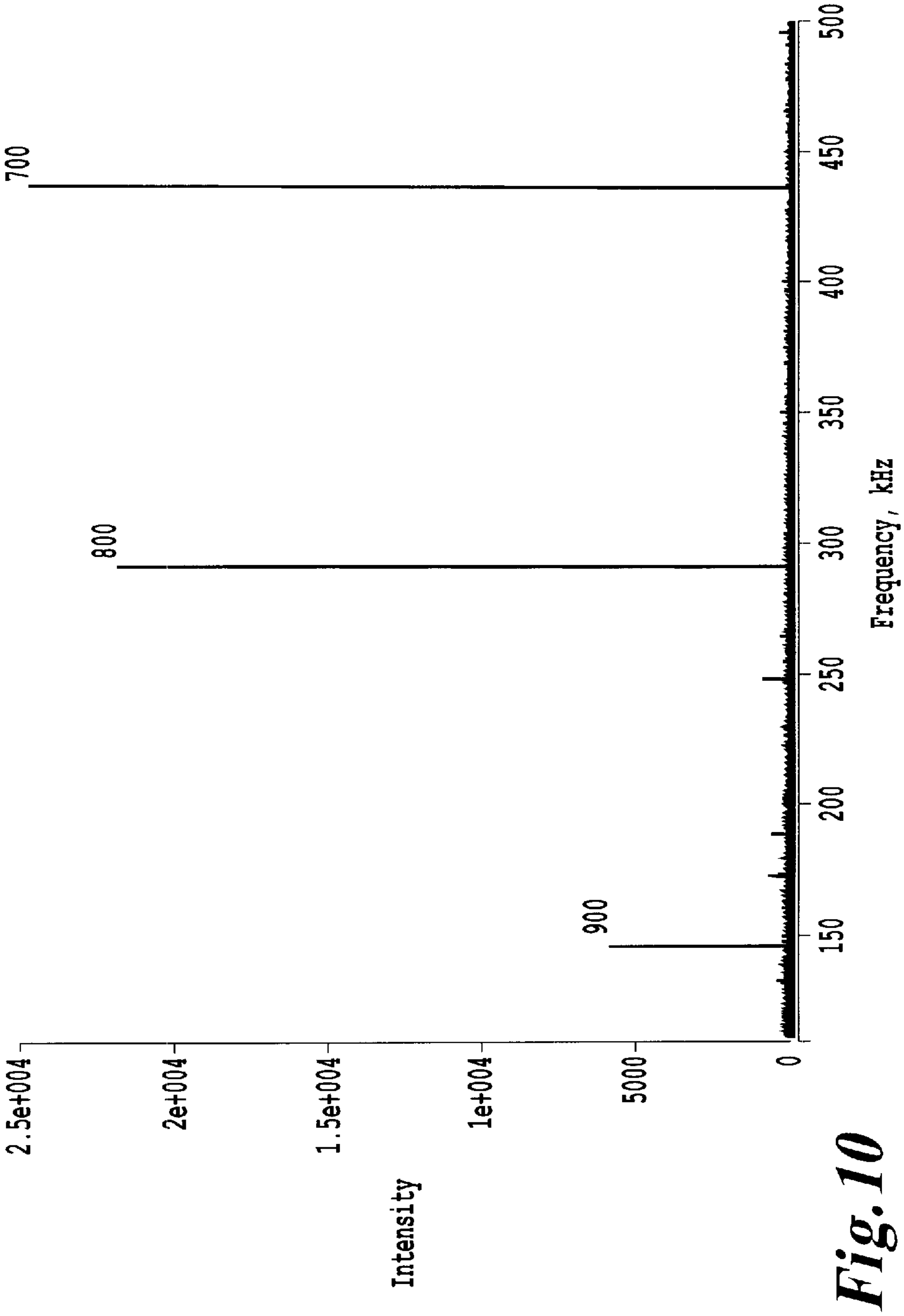
FIG. 10 is a spectrum obtained using an O-trap geometry ICR cell with six detection electrodes (M=3)

FIG. 10 shows a spectrum obtained using an O-trap ICR cell with six detection electrodes (M=3) in its "O-trap"-geometry detection compartment which illustrates the case when due to misalignments between electrodes of the O-trap and presence of the "synchronized magnetron motion" amplitudes of the subharmonic and side-shifted signal components are comparable to the amplitude of the overtone signal component. Spectral regions 700, 800, and 900 denote the triple overtone frequency, its second (800), and first (900) subharmonics and related side-shifted peaks respectively. The spectrum in FIG. 10 obtained using O-trap cell with six detection electrode (M=3) illustrates the case when, due to misalignments between electrodes of the O-trap, the presence of the "synchronized magnetron motion" amplitudes of the subharmonic and side-shifted signal components are comparable to the amplitude of the overtone signal component.

Figure 11:
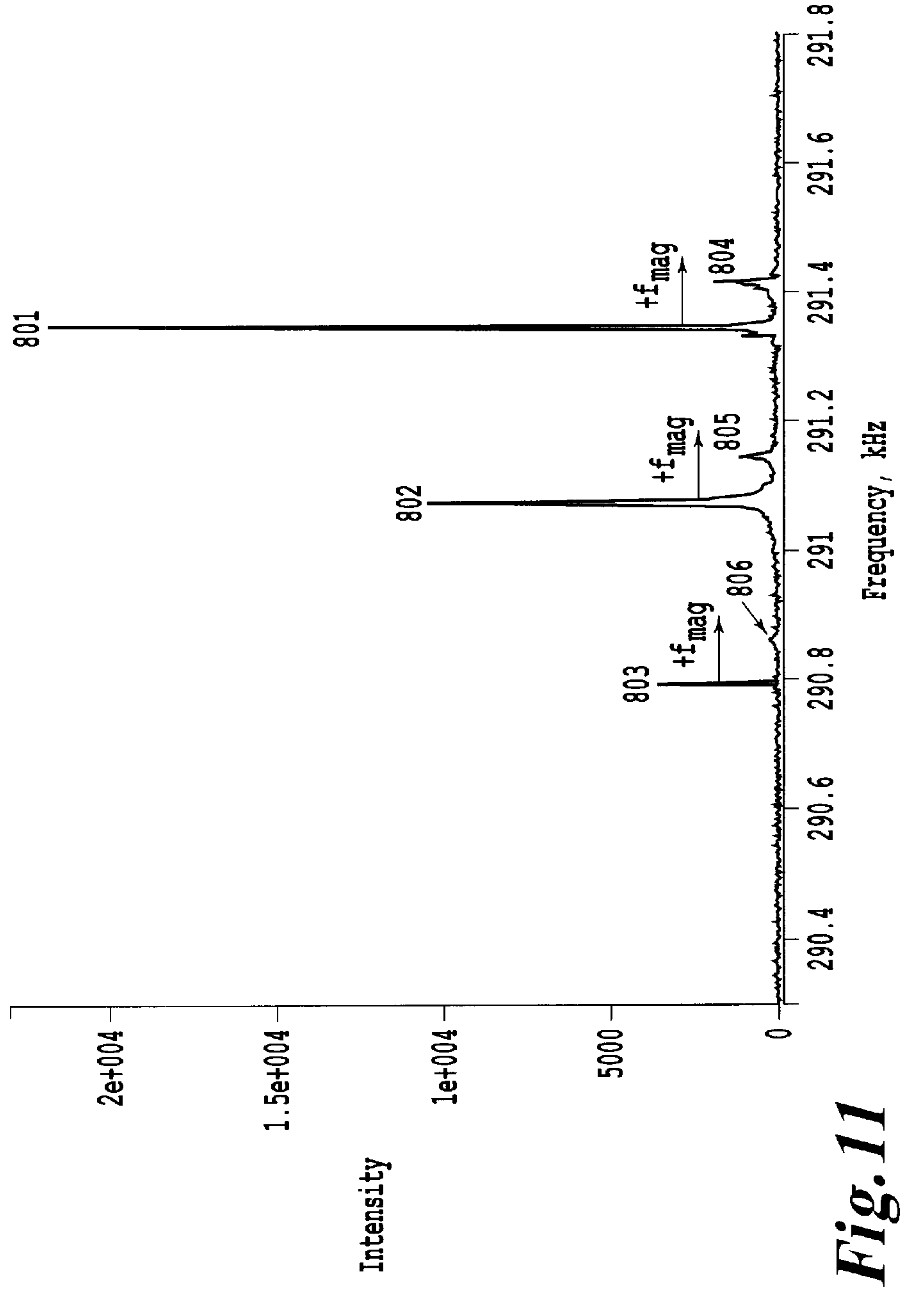
FIG. 11 is an expanded portion of the spectrum in FIG. 10.

FIG. 11 shows a zoomed-in or expanded portion of the spectrum in FIG. 10 around the second subharmonic frequency (800, FIG. 10). Spectral components corresponding to the isotopic distribution of the investigated ions (801, 802, and 803) are shown along with the corresponding side-shifted peaks (804, 805, and 806). The distance between the peaks 801 and 804, 802 and 805, 803 and 806 is equal to the magnetron frequency $f_{mag}$ as indicated in the Figure.

Information processing (such as FFT) in digital computers requires data representation in discrete and finite form. Therefore, frequency spectra obtained after Fourier transformation of the acquired time domain signal consist of series of consecutive frequency components with corresponding signal intensity of those components. A peak in the frequency spectrum which corresponds to a certain signal component (fundamental, overtone, harmonic or subharmonic) generally comprises a number of adjacent frequency components. In one embodiment of the invention, a peak-picking algorithm (typical for any FTICR-MS) is applied to the results of the Fourier transformation of the acquired time domain signal to identify frequency peaks $f_p$ present in it. Various peak-picking algorisms are described in literature, and (as a part of the algorithm) these procedures may include peak inclusion criteria based on: the signal-to-noise ratio; an isotopic structure; peak width; etc. The result of this algorithm is a peak list (pairs of frequency and intensity corresponding to the detected peaks). In addition, peak picking algorithm can provide information about peak width and shape, for example, in a form of set of frequency components (including frequency and corresponding intensity) composing that peak.

Peak Assignment Procedure

Assignment of peaks to ions of particular mass-to-charge ratio m/z is performed by way of peak assignment procedures.

Figure 12:
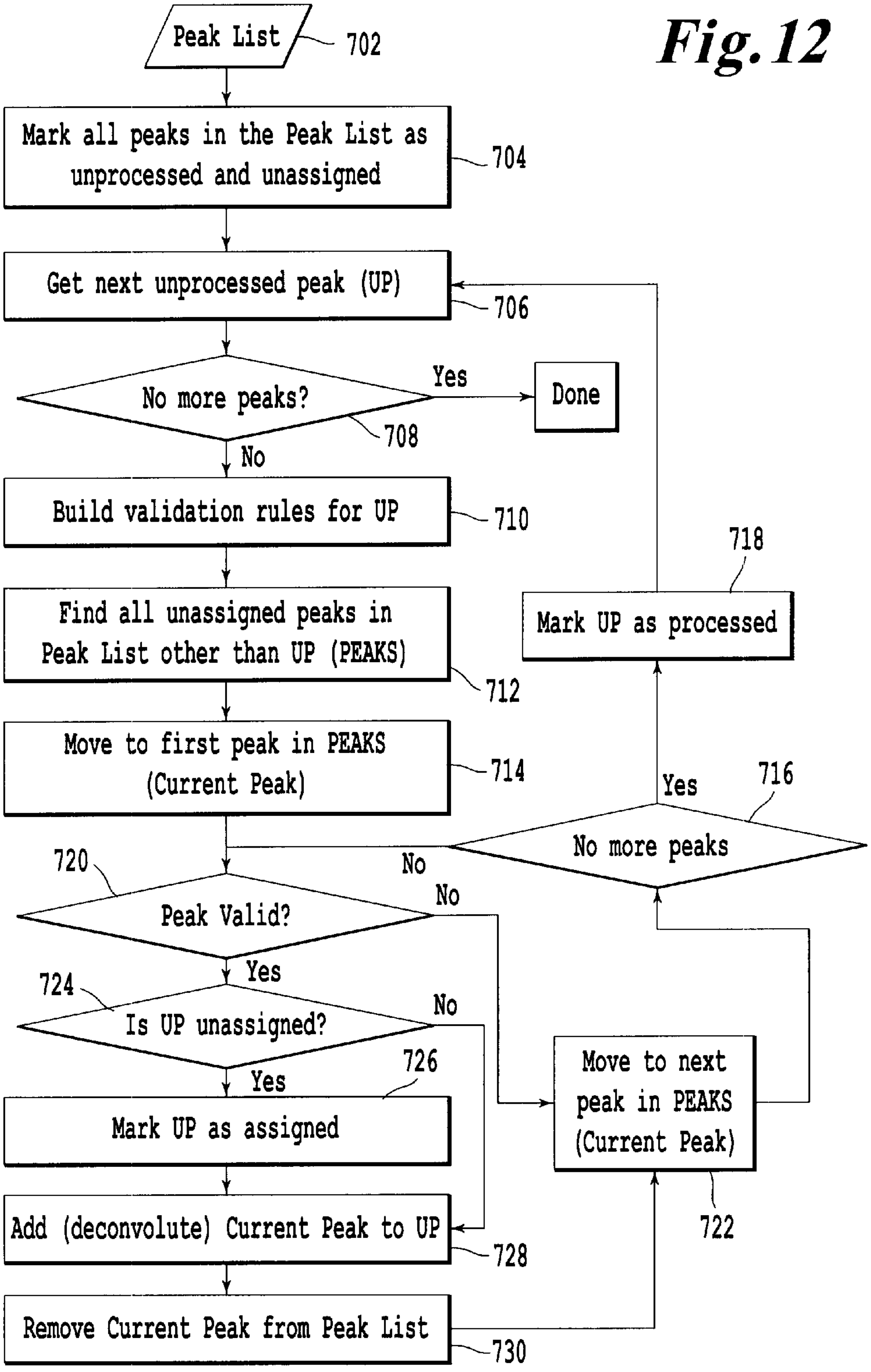
FIG. 12 is a flowchart of the peak assignment procedure, according to one embodiment of the invention.

A flowchart of this procedure according to one embodiment of the invention is presented in FIG. 12.

Peak-picking algorithm (typical for any FTICR-MS) is applied to the results of the Fourier transformation of the acquired time domain signal to generate the peak list which is the input parameter of the peak assignment procedure (step 702). At this step, all peaks in the peak list are considered as unassigned to any particular ion and also as unprocessed (step 704).

At the step 706, the procedure selects an unprocessed peak (referred to as UP) from the peak list. If there are no more unprocessed peaks, the procedure stops, otherwise the procedure moves to the next step 710 (step 708). At the step 710, the set of validation rules is built for the peak under consideration (UP) in accordance with the validation rules definition, as described below. At the step 712, the procedure selects all other unassigned peaks from the peak list (these peaks are referred to as PEAKS). At the step 714, the procedure selects the first peak from PEAKS (referred to as the Current Peak). The set of validation rules is applied to the current peak at the step 720.

If the Current Peak is valid, then the procedure proceeds to the step 724, otherwise the procedure goes to the step 722. The procedure checks whether UP is assigned to a particular ion or UP is not assigned to a particular ion at the step 724. The procedure marks UP as assigned at the step 726 if UP is unassigned, and proceeds to the step 728. If UP is assigned, then the procedure skips step 726 and proceeds to the step 728. Current peak is added (deconvoluted) with the UP peak at the step 728. Then, Current Peak is removed from the peak list at the step 730. After that the procedure moves to the step 722.

The procedure selects the next peak from PEAKS (referred to as the Current Peak) at the step 722. If there are no more peaks in PEAKS the procedure moves to the step 718, otherwise it moves to the step 720. At the step 718, UP is marked as processed and procedure moves to the step 706.

This procedure is applicable to all peaks in the peak list, starting, for example, from high frequencies toward low frequencies. This procedure includes the following steps for each peak in the peak list:

1. generation of validation rules
2. application of validation rules to all unassigned peaks from the peak list
3. application of the deconvolution procedure for all peaks that have passed the validation procedure during step 2 (and removing them from the unassigned peak list).

Validation Rules

A set of validation rules can be generated to identify which signal components are produced due to the motion of ions with the same m/z value. The set of rules and number of rules in it to be taken into account generally depends on particular detection system and experiment conditions. For example, in overtone detection system with six detection electrodes (M=3) ions with (reduced) cyclotron frequency f corresponding to their m/z value will generate an overtone signal at the frequency 3f along with a number of the corresponding harmonic, subharmonics and side-shifted peaks. These peaks belong to the same group of signal components. The following set of rules describes position of the overtone frequency (rule m) and possible positions of the subharmonics (rules l, k), harmonics (rules n, . . . ) and corresponding side-shifted peaks (rules l+1, l+2, . . . , k+1, k+2, . . . , m+1, . . . , n+1, . . . ) in that group:

$$f_{pl}=f \quad (l)$$

$$f_{p(l+1)}=f+f_{mag}, \quad (l+1)$$

$$f_{p(l+2)}=f+2f_{mag}, \quad (l+2)$$

. . .

$$f_{pk}=2f \quad (k)$$

$$f_{p(k+1)}=2f+f_{mag} \quad (k+1)$$

$$f_{p(k+2)}=2f+f_{mag}, \quad (k+2)$$

. . .

$$f_{pm}=3f \quad (m)$$

$$f_{p(m+1)}=3f+f_{mag} \quad (m+1)$$

. . .

$$f_{pm}=4f \quad (n)$$

$$f_{p(m+1)}=4f+f_{mag} \quad (n+1)$$

. . .

where $f_{mag}$ is an ion magnetron motion frequency.

For each peak with frequency $f_p$ in the peak list, one first assumes that this peak is an overtone signal corresponding to the ions with the (reduced) cyclotron frequency $f=f_p/3$. Further, using the rules shown above, the peak list is checked for presence of peaks that satisfy those rules (the peak assignment is done with a peak measurement accuracy $\Delta f$ in mind: $f=f_{measured}\pm\Delta f$). All these peaks are considered as peaks belonging to the same group of signal components associated with the same ions and can therefore be deconvoluted into one peak associated with these ions as described below.

Deconvolution Procedure

Assume that two peaks belong to the same group of signal components: the "main" peak at $f_{pm}$ composed of a set M of frequency components $f_m$ with the amplitude $A(f_m)$ in the vicinity of $f_{pm}$ corresponding to the overtone detection signal; and another peak $f_{pi}$ composed of a set H of frequency components $f_i$ with the amplitude $A(f_i)$ in the vicinity of $f_{pi}$, corresponding to a subharmonic, harmonic or side-shifted signal component. In one embodiment of the invention, these peaks are deconvoluted into one peak based on the following equations:

$$A_{dec}(f_i)=0 \text{ for all } f_i\in H,$$

$$A_{dec}(f_m)=A(f_m)\sqrt{\frac{\sum_{f_i\in M}A^2(f_i)+\sum_{f_i\in H}A^2(f_i)}{\sum_{f_i\in M}A^2(f_i)}} \quad \text{for all } f_m\in M$$

where $A_{dec}(f)$ corresponds to the new deconvoluted amplitudes of the frequency components f, with $A_{dec}(f_m)$ representing a new "deconvoluted" peak.

If there is one more peak belonging to the same group of signal components, one adds (deconvolutes) it to the "deconvoluted" peak above using the above formulae one more time. Otherwise, the deconvolution step described above for two peaks can be extended to include more than two peaks. In this case, the set H in the above formula should include the frequency components $f_i$ in the vicinities of all subharmonic, harmonic and side-shifted frequency peaks belonging to this group.

The formula above describes the deconvolution procedure for frequency components associated with the peaks belonging to the same group of signal components.

It can also be rewritten directly for the peaks (at the assumption that all peaks have the same peak shape):

$$A_{Pdec}(f_{pi})=0 \text{ for all } f_{pi}\in H,$$

$$A_{Pdec}(f_{pm})=\sqrt{A_P^2(f_{pm})+\sum_{f_{pi}\in H}A_P^2(f_{pi})}$$

for the "main" peak with the frequency $f_{pm}$ where $A_p(f_p)$ and $A_{Pdec}(f_p)$ are amplitudes of the frequency peaks $f_p$ before and after the deconvolution; m denotes the "main" peak of the group corresponding to the fundamental or overtone frequency; and H denotes a set of all subharmonic, harmonic and side-shifted frequency peaks belonging to the same group of signal components.

Figure 13:
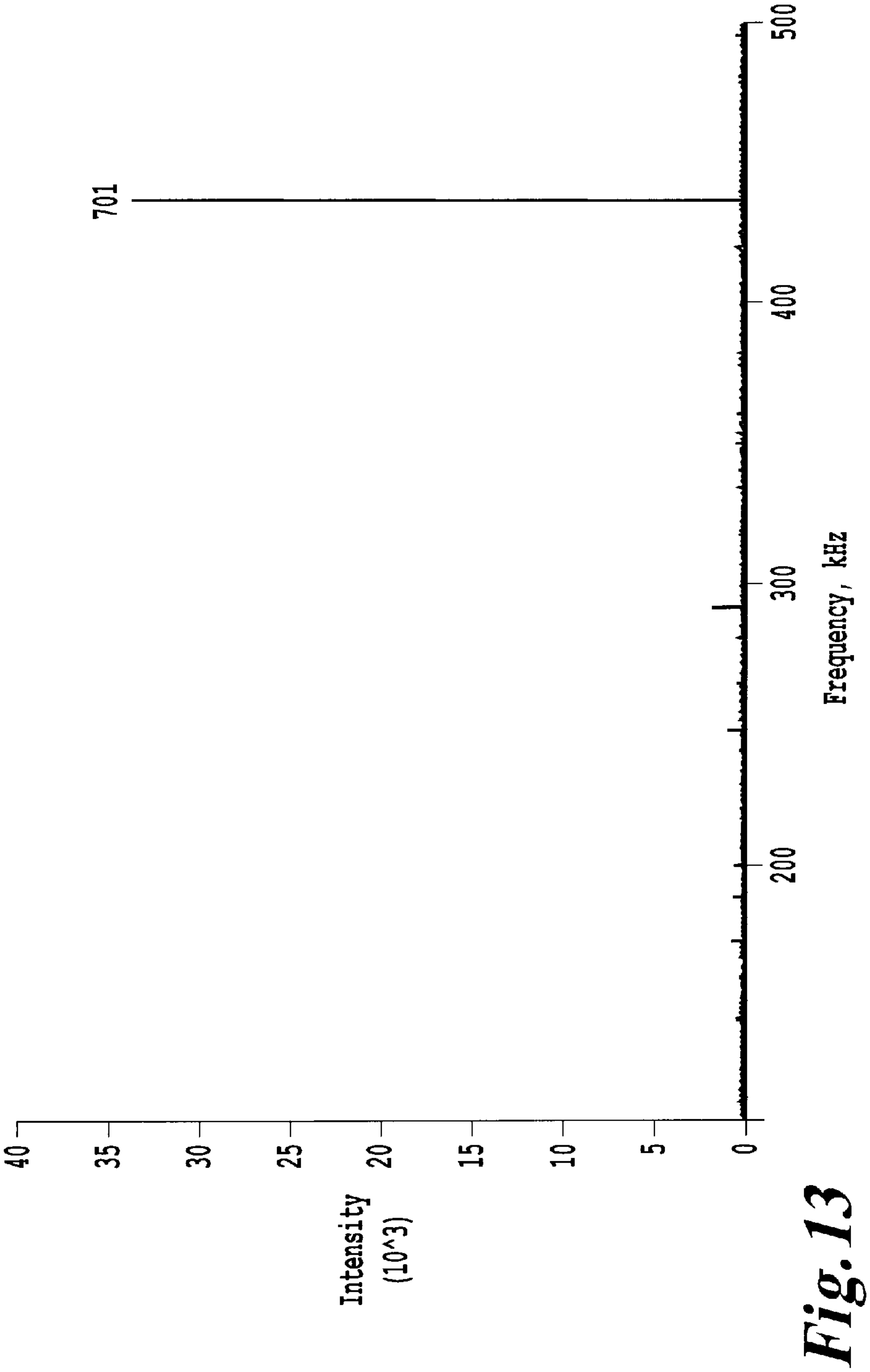
FIG. 13 is a schematic depiction of the results of the peak assignment procedure for deconvolution of the spectrum shown in FIG. 10.

FIG. 13 demonstrates results of application of the deconvolution procedure for the spectrum shown in FIG. 10. Note the increased signal amplitude in the spectral region 701 corresponding to the triple overtone frequency.

The above algorithm fully provides a unique capability (e.g., in ICR-MS) to fully resolve ion peaks due to its very high resolving power. In case of very complicated spectra, where some peaks can overlap, the above algorithm can further be improved, for example, by including an instrument-specific distribution of the intensities of subharmonic, harmonic and side-shifted frequency peaks in the ICR-MS spectra into the algorithm. An instrument-specific distribution of the intensities of signal components (harmonics, subharmonics, side-shifted peaks) can, for example describe typical ratios of those signal components (with certain variation ranges) specific to a particular instrument hardware configuration (such as the FT-ICR cell geometry and its assembly tolerances) and experimental parameters which define the ion motion characteristics in the cell. This information can be included into the validation rules and used in the peak assignment procedure described above. Another way to improve the peak assignment procedure is to include an isotopic distribution of ions (such as the one shown in the FIG. 11), which can be predicted from natural abundances of chemical elements) into the algorithm. For example, isotopic peak attributes can be included into the validation rules so peaks not having isotopic partners will not be considered by the deconvolution procedure.

The deconvolution procedure described above can incorporate side-shifted peaks other than those arising due to the ion magnetron motion by using appropriate validation rules for those types of peaks. Therefore, the scope of the invention is not bound to a particular type of the side-shifted peaks.

Numerous modifications and variations of the invention are possible in light of the above teachings. It is therefore to be understood that within the scope of the appended claims, the invention may be practiced otherwise than as specifically described herein.

The invention claimed is:

1. A method for deconvolution of a frequency spectrum obtained in an ICR mass spectrometer based on a detection of ion oscillation overtones of the M-th order (where the integer M>1), comprising steps of:

collecting a plurality of frequency peaks, including at least two of overtone frequency peaks, subharmonic frequency peaks, higher harmonic frequency peaks, and side-shifted frequency peaks of said ion oscillation overtones of the M-th order, where the integer M>1, within the frequency spectrum corresponding respectively to oscillations of different groups of ions;

associating at least one of the frequency peaks having a frequency f and a measured amplitude A with a particular group of said ions;

identifying whether said frequency peak is related to one of an overtone frequency, a subharmonic frequency, a higher harmonic frequency, or a side-shifted frequency of said oscillations of said different group of ions;

deriving calculated amplitudes of the overtone frequency peaks associated with said groups of ions by incorporating measured amplitudes of the frequency peaks related to the subharmonic frequency, the higher harmonic frequency, or the side-shifted frequency associated with said groups of ions into the calculated amplitudes of said overtone frequency peaks;

generating a deconvoluted frequency spectrum including the overtone frequency peaks associated with said different groups of ions, said overtone frequency peaks in the deconvoluted frequency spectrum having respective said calculated amplitudes.

2. The method of claim 1, wherein said deriving comprises:

summing the squared amplitudes of said subharmonic, higher harmonic, or side-shifted frequency components;

calculating a total sum by adding the squared amplitude of said overtone frequency component to said sum; and extracting the square root of said total sum.

3. The method of claim 1, wherein the relation of said frequency peaks to the overtone, subharmonic, or higher harmonic frequencies is based on satisfying by the frequency f of said frequency peak of an equation linking said frequency peak to a frequency peak series in said frequency spectrum, said series being defined by a frequency parameter $F_M$ and an integer parameter m>1:

$$f=(m/M)F_M$$

where the cases of m<M, m=M, and m>M correspond to the subharmonic, overtone, and higher harmonic frequencies, respectively.

4. The method of claim 3, wherein said frequency peak series comprises at least one frequency peak corresponding to m=M.

5. The method of claim 1, wherein the relation of said frequency peak to the side-shifted frequencies is based on satisfying by the frequency f of said frequency peak one of equations:

$$f=f_{m/M}+kf_{side}, \text{ or } f=f_{m/M}-kf_{side}$$

where $f_{m/M}$ is a frequency of any subharmonic, overtone or higher harmonic frequency peak; $f_{side}$ is a possible shift of the $f_{m/M}$ frequency due to the ion magnetron or axial motion; and k>1.

6. The method of claim 1, further comprising:

associating said frequency peak with a subharmonic, overtone, or higher harmonic frequency by using ion isotope frequency peaks corresponding to said frequency peak.

7. The method of claim 1, further comprising:

utilizing a Fourier transform method to obtain the frequency spectrum.

8. The method of claim 1, further comprising:

utilizing at least one of shifted-basis techniques, filter-diagonalization method, wavelet transform, or chirplet transform to obtain the frequency spectrum.

9. The method of claim 1, wherein said ICR mass spectrometer comprises an ion trap cell and said ion oscillations take place in said ion trap cell.

10. The method of claim 1, wherein said ion trap cell comprises an "O-trap"-geometry cell.

11. A system for deconvoluting a frequency spectrum obtained in an ICR mass spectrometer based on detection of ion oscillation overtones of the M-th order (where the integer M>1), comprising:

a data collection unit configured to collect a plurality of frequency peaks, including at least two of overtone frequency peaks, subharmonic frequency peaks, higher harmonic frequency peaks, and side-shifted frequency peaks of said ion oscillation overtones of the M-th order, where the integer M>1, within the frequency spectrum corresponding to oscillations of different groups of ions, to associate at least one the frequency peaks having a frequency f and an amplitude A with a particular group of said ions and identify whether said frequency peak is related to the overtone frequency of oscillations of said group of ions, a subharmonic frequency, a higher harmonic frequency, or a side-shifted frequency thereof; and a data processing unit configured to 1) generate calculated amplitudes of the overtone frequency peaks associated with said groups of ions by incorporating the amplitudes of the frequency peaks related to subharmonic, higher harmonic, or side-shifted frequencies associated with said groups of ions into the calculated amplitudes of said overtone frequency peaks;

2) generate a deconvoluted frequency spectrum composed of the overtone frequency peaks associated with said different groups of ions, said overtone frequency peaks in the deconvoluted frequency spectrum having respective said calculated amplitudes.

12. The system of claim 11, wherein the data collection unit comprises:

means for investigating a plurality of frequency peaks within the frequency spectrum corresponding to oscillations of different groups of ions by associating each of the frequency peak having a frequency f and an amplitude A with a particular group of said ions and identifying whether said frequency peak is related to the overtone frequency of oscillations of said group of ions, the subharmonic frequency, the higher harmonic frequency, or the side-shifted frequency thereof.

13. The system of claim 11, wherein the data processing unit comprises:

means for calculating new amplitudes of the overtone frequency peaks associated with said groups of ions by incorporating the amplitudes of the frequency peaks related to subharmonic, higher harmonic, or side-shifted frequencies associated with said groups of ions into the new amplitudes of said overtone frequency peaks.

14. The system of claim 11, wherein the data processing unit comprises:

means for generating a deconvoluted frequency spectrum composed of the overtone frequency peaks associated with said different groups of ions, each of said overtone frequency peaks having respective said calculated amplitude.

15. A method of deconvolution of a frequency spectrum obtained in an ICR mass spectrometer based on detection of ion fundamental oscillations corresponding to an ion oscillation overtone of the first order (M=1), comprising steps of:

investigating a plurality of frequency peaks, including at least two of fundamental frequency peaks, harmonic frequency peaks, and side-shifted frequency peaks of said ion fundamental oscillations corresponding to said ion oscillation overtone of the first order (M=1), within the frequency spectrum corresponding to oscillations of different groups of ions by associating each of the frequency peak having a frequency f and an amplitude A with a particular group of said ions and identifying whether said frequency peak is related to the fundamental frequency of oscillations of said group of ions, the harmonic frequency, or the side-shifted frequency thereof;

generating calculated amplitudes of the fundamental frequency peaks associated with said groups of ions by incorporating the amplitudes of the frequency peaks related to harmonic or side-shifted frequencies associated with said groups of ions into the calculated amplitudes of said fundamental frequency peaks;

generating a deconvoluted frequency spectrum composed of the fundamental frequency peaks associated with said different groups of ions, said fundamental peaks in the deconvoluted frequency spectrum having respective said calculated amplitudes.

16. A system for deconvoluting a frequency spectrum obtained in an ICR mass spectrometer based on detection of ion fundamental oscillations corresponding to an ion oscillation overtone of the first order (M=1), comprising:

a data collection unit configured to collect a plurality of frequency peaks within the frequency spectrum, including at least two of fundamental frequency peaks, harmonic frequency peaks, and side-shifted frequency peaks of said ion fundamental oscillations corresponding to said ion oscillation overtone of the first order (M=1), within the frequency spectrum corresponding to oscillations of different groups of ions by associating each of the frequency peak having a frequency f and an amplitude A with a particular group of said ions and identifying whether said frequency peak is related to the fundamental frequency of oscillations of said group of ions, a harmonic frequency, or a side-shifted frequency thereof; and a data processing unit configured to generate calculated amplitudes of the fundamental frequency peaks associated with said groups of ions by incorporating the amplitudes of the frequency peaks related to harmonic or side-shifted frequencies associated with said groups of ions into the calculated amplitudes of said fundamental frequency peaks;

generate a deconvoluted frequency spectrum composed of the fundamental frequency peaks associated with said different groups of ions, said fundamental peaks in the deconvoluted frequency spectrum having respective said calculated amplitudes.

17. The system of claim 16, wherein the data collection unit comprises:

a data collection unit algorithm which investigates a plurality of frequency peaks within the frequency spectrum corresponding to oscillations of different groups of ions by associating each of the frequency peak having a frequency f and an amplitude A with a particular group of said ions and identifying whether said frequency peak is related to the fundamental frequency of oscillations of said group of ions, a harmonic frequency, or a side-shifted frequency thereof

18. The system of claim 16, wherein the data processing unit comprises:

a data processing unit algorithm which generates calculated amplitudes of the fundamental frequency peaks associated with said groups of ions by incorporating the amplitudes of the frequency peaks related to harmonic or side-shifted frequencies associated with said groups of ions into the calculated amplitudes of said fundamental frequency peaks.

19. The system of claim 16, wherein the data processing unit comprises:

a data processing unit algorithm which generates a deconvoluted frequency spectrum composed of the fundamental frequency peaks associated with said different groups of ions, each of said fundamental peaks component having respective said calculated amplitude.

* * * * *